US010128242B2

(12) United States Patent
Galy et al.

(10) Patent No.: US 10,128,242 B2
(45) Date of Patent: *Nov. 13, 2018

(54) SUBSTRATE CONTACT LAND FOR AN MOS TRANSISTOR IN AN SOI SUBSTRATE, IN PARTICULAR AN FDSOI SUBSTRATE

(71) Applicant: STMicroelectronics SA, Montrouge (FR)

(72) Inventors: Philippe Galy, Le Touvet (FR); Sotirios Athanasiou, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/804,669

(22) Filed: Nov. 6, 2017

(65) Prior Publication Data
US 2018/0061833 A1    Mar. 1, 2018

Related U.S. Application Data

(63) Continuation of application No. 15/041,593, filed on Feb. 11, 2016, now Pat. No. 9,837,413.

(30) Foreign Application Priority Data

Jul. 9, 2015    (FR) .................................... 15 56515

(51) Int. Cl.
*H01L 27/092*    (2006.01)
*H01L 27/12*    (2006.01)
(Continued)

(52) U.S. Cl.
CPC ........ *H01L 27/092* (2013.01); *H01L 21/8238* (2013.01); *H01L 21/823871* (2013.01);
(Continued)

(58) Field of Classification Search
CPC ... H01L 27/092; H01L 21/84; H01L 27/1203; H01L 23/528; H01L 21/8238; H01L 21/823871; H01L 27/1211; H01L 29/0847; H01L 29/165; H01L 29/1033; H01L 21/845; H01L 29/78615
USPC .................................................. 257/347, 348
See application file for complete search history.

(56) References Cited

U.S. PATENT DOCUMENTS 5,164,805 A    11/1992    Lee
5,573,961 A    11/1996    Hsu et al.
(Continued)

FOREIGN PATENT DOCUMENTS

JP    2004063600 A    2/2004

OTHER PUBLICATIONS

Galy, Philippe, et al: "BIMOS Transistor in Thin Silicon Film and New Solutions for ESD Protection in FDSOI UTBB CMOS Technology," EUROSOI-ULIS 2015, 2015 IEEE, pp. 29-32.
(Continued)

*Primary Examiner* — Caleen Sullivan
(74) *Attorney, Agent, or Firm* — Crowe & Dunlevy

(57) ABSTRACT

A substrate contact land for a first MOS transistor is produced in and on an active zone of a substrate of silicon on insulator type using a second MOS transistor without any PN junction that is also provided in the active zone. A contact land on at least one of a source or drain region of the second MOS transistor forms the substrate contact land.

14 Claims, 6 Drawing Sheets

(51) Int. Cl.

| | | |
|---|---|---|
| *H01L 29/786* | (2006.01) | |
| *H01L 29/08* | (2006.01) | |
| *H01L 29/10* | (2006.01) | |
| *H01L 29/165* | (2006.01) | |
| *H01L 23/528* | (2006.01) | |
| *H01L 21/8238* | (2006.01) | |
| *H01L 21/84* | (2006.01) | |
| *H01L 29/66* | (2006.01) | |

(52) U.S. Cl.
CPC ............ *H01L 21/84* (2013.01); *H01L 23/528* (2013.01); *H01L 27/1203* (2013.01); *H01L 29/66772* (2013.01); *H01L 29/78603* (2013.01); *H01L 29/78615* (2013.01); *H01L 29/78648* (2013.01); *H01L 29/78654* (2013.01); *H01L 29/0847* (2013.01); *H01L 29/1033* (2013.01); *H01L 29/165* (2013.01)

(56) References Cited

U.S. PATENT DOCUMENTS

| | | | |
|---|---|---|---|
| 5,637,899 | A | 6/1997 | Eimori et al. |
| 6,387,739 | B1 | 5/2002 | Smith, III |
| 7,084,462 | B1 | 8/2006 | Warnock et al. |
| 9,019,666 | B2 | 4/2015 | Bourgeat et al. |
| 9,716,136 | B1 | 7/2017 | Abou-Khalil et al. |
| 9,837,413 | B2 * | 12/2017 | Galy .................... H01L 27/092 |
| 2002/0027246 | A1 | 3/2002 | Kunikiyo |
| 2003/0155615 | A1 | 8/2003 | Yoshida et al. |
| 2004/0036118 | A1 | 2/2004 | Abadeer et al. |
| 2005/0184341 | A1 | 8/2005 | Wei et al. |
| 2008/0290413 | A1 | 11/2008 | Mandelman et al. |
| 2009/0283832 | A1 | 11/2009 | Sugiura |
| 2011/0031552 | A1 | 2/2011 | Iwamatsu et al. |
| 2012/0205744 | A1 | 8/2012 | O et al. |
| 2013/0141824 | A1 | 6/2013 | Bourgeat et al. |
| 2014/0346601 | A1 | 11/2014 | Sugiura |

OTHER PUBLICATIONS

INPI Search Report and Written Opinion for FR 1556515 dated Apr. 27, 2016 (10 pages).

Cristoloveanu, Sorin et al: "A Review of Electrical Characterization Techniques for Ultrathin FDSOI Material and Devices," Solid-State Electronics 117, 2016 (pp. 10-36).

Lim, Hyung-Kyu etal: "Threshold Voltage of Thin-Film Silicon on Insulator (SOI) MOSFETs," IEEE Transactions on Electron Devices, vol. ED-30, No. 10, Oct. 1983 (pp. 1244-1251).

* cited by examiner

SUBSTRATE CONTACT LAND FOR AN MOS TRANSISTOR IN AN SOI SUBSTRATE, IN PARTICULAR AN FDSOI SUBSTRATE

CROSS REFERENCE TO RELATED APPLICATIONS

This application is a continuation of U.S. application patent Ser. No. 15/041,593 filed Feb. 11, 2016, which claims priority from French Application for Patent No. 1556515 filed Jul. 9, 2015, the disclosures of which are incorporated by reference.

TECHNICAL FIELD

Embodiments relate to integrated circuits, and more particularly to hybrid operation MOS transistors produced on substrates of silicon on insulator type, commonly referred to by those skilled in the art by the acronym "SOI", in particular a substrate of the fully depleted silicon on insulator type, known by those skilled in the art by the acronym "FDSOI".

BACKGROUND

Hybrid operation MOS transistors are known and are advantageous notably for electrostatic discharge (ESD) protection applications. Those skilled in the art will be able, for example, to refer to the United States Patent Application Publication No. 2013/0141824 (incorporated by reference) which describes this type of transistor.

These transistors are produced on bulk substrates. Now, electrical simulations have shown (see, Galy, et al. "BIMOS transistor in thin silicon film and new solutions for ESD protection in FDSOI UTBB CMOS technology", EURO-SOI-ULIS 2015, 26-28 Jan. 2015, Bologne, Italy (incorporated by reference)) that there would be advantages from an electrical point of view in producing these hybrid operation transistors on a substrate of FDSOI type for an ESD protection application.

However, the very small thickness of the semiconductor film (typically of the order of 7 nm) does not make it possible to directly produce a contact land on an FDSOI substrate for this type of transistor.

SUMMARY

According to one embodiment, it is proposed to simply produce a transistor on an FDSOI type substrate in which a substrate contact land has been produced.

Thus, according to one aspect, a method is proposed for producing at least one substrate contact land for an MOS transistor, for example an NMOS transistor, produced in and on an active zone of a substrate of silicon on insulator (SOI) type, in particular of the fully depleted silicon on insulator (FDSOI) type, comprising a production in said active zone of at least one second MOS transistor, for example a PMOS transistor, without any PN junction having at least one contact land on at least one of its source or drain regions, this source and/or drain contact land forming said at least one substrate contact land.

Thus, a transistor without any junction is used not functionally as transistor but as connection element making it possible to use the source and/or drain region as substrate land.

In effect, the inventors have observed that, during the biasing of the drain or of the source of the second transistor, and despite the high resistance of the intrinsic silicon, a low current circulates, but one that is sufficient to allow for a substrate biasing of the first transistor.

And this is easy to produce through a joint production of the two MOS transistors on the same active zone by using a conventional CMOS method, and most particularly advantageous in the FDSOI technology because use is advantageously made of the raised source and drain regions (the raising being inherent to the fabrication method) of the junction-free transistor to easily take a contact on at least one of these source or drain regions so as to produce a substrate contact land without risk of damaging the semiconductor film of the FDSOI substrate.

The method can further comprise a production in the active zone of at least one third MOS transistor without any PN junction, the first MOS transistor being bracketed by the second and the third MOS transistors, the third MOS transistor comprising at least one contact land on at least one of its source or drain regions, this source or drain contact land forming a second substrate contact land for the NMOS transistor, the insulated gate regions of the three MOS transistors being advantageously produced in the same line of gate material.

According to another aspect, an integrated electronic device is proposed that comprises
- an intrinsic semiconductor film above a buried insulating layer, itself situated above a bearer substrate, an insulating region delimiting an active zone in the semiconductor film,
- a first MOS transistor, situated in and on a first part of the active zone (typically comprising PN junctions between the source/drain regions and the channel region, an insulated gate region above the channel region, a source contact land, a drain contact land, and a gate contact land) and
- at least one connection element situated in and on a second part of the active zone, structurally similar to a second MOS transistor without any PN junctions between its source/drain regions and its channel region (typically having an insulated gate region above its channel region), at least one source or drain contact land forming at least one substrate contact land for the first transistor.

Advantageously, the gate regions of the two transistors are linked and incorporated in a same line of gate material.

The second transistor further comprises a source contact land and a drain contact land that are mutually electrically linked by an electrically conductive link.

According to one embodiment, the device can comprise a second connection element structurally similar to the first connection element and therefore to a third MOS transistor without any PN junction between its source/drain regions and its channel region, situated in and on a third part of the active zone, the first part of the active zone being situated between the second and third parts, at least one source or drain contact land of the third MOS transistor forming a second substrate contact land for the first MOS transistor.

Advantageously, the gate regions of the three transistors are linked and incorporated in a same line of gate material.

The third transistor further comprises a source contact land and a drain contact land that are mutually electrically linked by an electrically conductive link.

The device also comprises, in the bearer substrate, a single semiconductor well situated under said active zone and a well land intended to bias said well.

Advantageously, the silicon film is of intrinsic P type, the first transistor is an NMOS transistor, and the other transistor or transistors is/are PMOS transistors.

BRIEF DESCRIPTION OF THE DRAWINGS

Other advantages and features of the invention will become apparent on studying the detailed description of implementations, that are in no way limiting, and the attached drawings in which.

DETAILED DESCRIPTION

Figure 1:
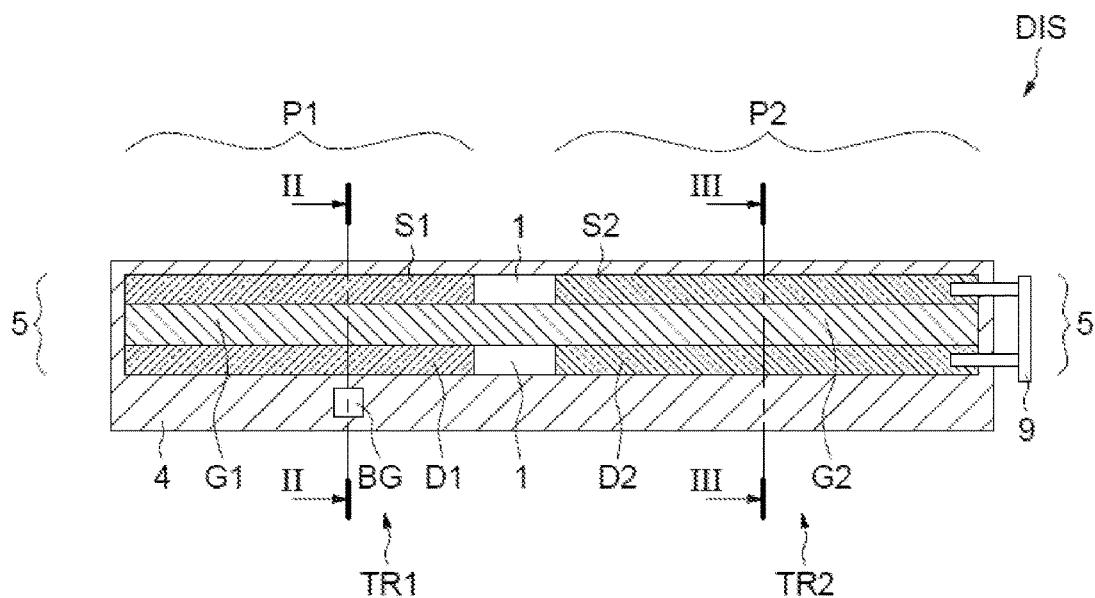
FIG. 1 is a plan view of an integrated device.
Figures 2, 3:
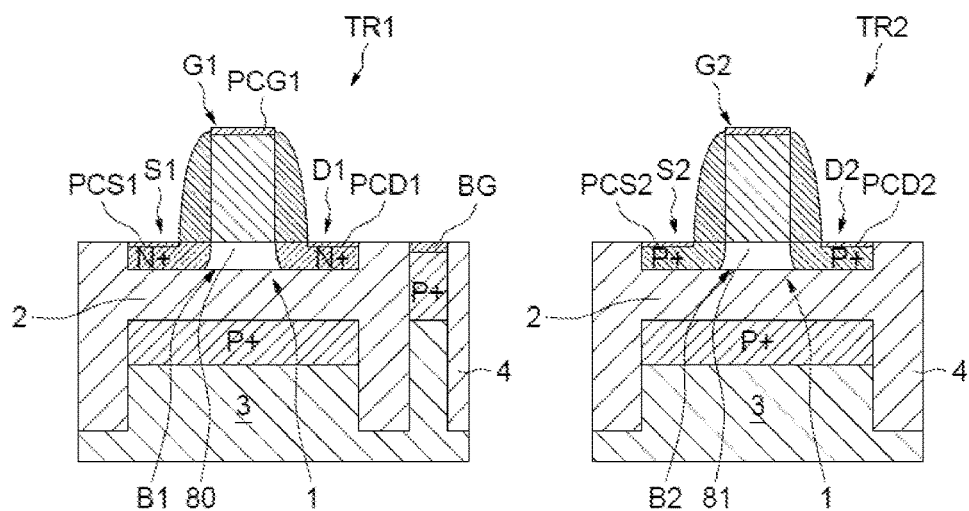
FIGS. 2 and 3 are cross-sectional views of FIG. 1.

FIG. 1 illustrates a plan view of an integrated device DIS according to one embodiment, for which FIGS. 2 and 3 are cross-sectional views along the lines II-II and III-III of FIG. 1.

The device DIS comprises a substrate of FDSOI type, which comprises a semiconductor film 1 above a buried insulating layer 2 ("BOX", standing for Buried Oxide), itself situated above a bearer substrate comprising a semiconductor well 3.

The well 3 is here of P type and comprises an upper zone (in contact with the BOX) of P+ type which makes it possible to bias the device via the rear face.

An insulating region 4 of shallow trench type ("STI", standing for Shallow Trench Isolation) delimits an active zone 5 in the semiconductor film 1.

The semiconductor film 1 comprises a fully depleted semiconductor material which in practice is an intrinsic material, for example intrinsic silicon of P type, that is to say very weakly doped ($10^{15}$ atoms/cm$^3$).

In a first part P1 of the device, a first MOS transistor TR1 has been produced, for example an NMOS transistor.

This first transistor TR1 comprises source S1 and drain D1 semiconductor regions, with N+ type doping, a channel region 80 and an insulated gate region G1.

The reference B1 denotes the substrate ("bulk") of the transistor TR1.

According to a conventional embodiment in the substrates of FDSOI type, the drain D1 and source S1 regions are produced in a raised manner by epitaxial growth, but this raising has not been represented in the figures in the interests of simplification.

The silicidation zones PCG1, PCD1, and PCS1, are, in this example, produced respectively on the gate G1, drain D1 and source S1 regions, and respectively form gate, drain and source contact lands.

In a second part P2 of the semiconductor film 1, a second MOS transistor TR2 has been produced, for example a transistor of PMOS type.

It comprises P$^+$ type doped drain D2 and source S2 semiconductor regions, a channel region, and an insulated gate region G2.

The reference B2 denotes the substrate of the transistor TR2. The substrates B1 and B2 are therefore electrically linked because they are formed in the same active zone 5.

The silicidation zones PCD2 and PCS2 are produced respectively on the drain D2 and source S2 regions and respectively form the drain and source contact lands.

The gate regions G1 and G2 of the two transistors TR1 and TR2 are produced in a same line of gate material. They are therefore here electrically connected and the land PCG1 is common to the gates G1 and G2.

Since the semiconductor film 1 is of intrinsic P type, the second transistor TR2 has no PN junction. Consequently, the biasing of one of its source S2 or drain D2 regions makes it possible to bias the substrate B2 and therefore the substrate B1 of the first transistor TR1.

In this example, an electrical link 9 formed by vias and a metallization links the source S2 and drain D2 regions of the transistor TR2.

The device DIS therefore comprises a transistor TR1 on a substrate of FDSOI type comprising a substrate land (here PCS1 and PCD1) produced via the second transistor TR2. The second transistor TR2 is therefore not used as such, but serves simply as connection element for the biasing of the substrate B1.

The device DIS further comprises a contact land BG that makes it possible to bias the wells 3. Given that the wells 3 of the two transistors TR1 and TR2 are common, the contact BG makes it possible to bias both the rear face of the first transistor TR1 and that of the second transistor TR2.

Figure 4:
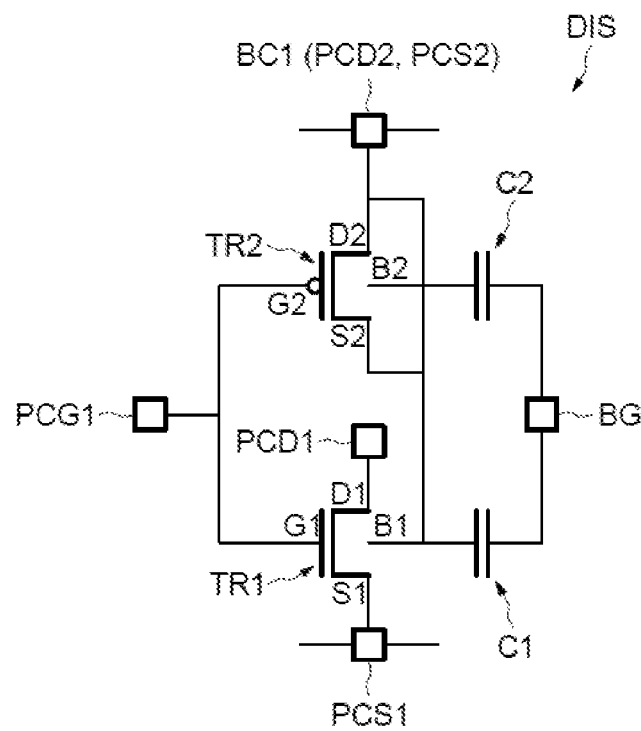
FIG. 4 is a schematic representation of the FIG. 1 device from an electrical point of view.

A schematic representation of the device DIS from an electrical point of view is illustrated in FIG. 4.

The transistor TR1 is represented therein, comprising its drain D1, source S1 and gate G1 regions, the contact lands PCG1, PCD1, PCS1, and the second transistor TR2 with its drain D2, source S2 and gate G2 regions, and the contact lands PCG1, PCD2, PCS2, the last two forming a substrate contact land BC1.

Two capacitors C1 and C2 schematically represent the capacitors formed under each of the transistors TR1 and TR2 by the semiconductor film 1, the insulating layer 2, and the well 3. Given that, in this embodiment, the wells of the two transistors TR1 and TR2 are linked, the capacitors C1 and C2 are represented as connected to the same rear gate contact BG.

Similarly, given that the gates G1 and G2 are produced in the same line of gate material, they are represented as connected to the same gate contact land PCG1.

It would have been possible to produce two independent gates in order, for example, to bias the gate of the second transistor TR2 independently of that of the first transistor TR1. It would thus be possible, by adjusting the bias voltage value of the gate G2 of the second transistor TR2, to modulate the access resistance of the first transistor TR1 without affecting the operation thereof.

However, the production of the two gates G1 and G2 in a same line of gate material is advantageous from the point of view of the production method.

The source and drain regions of the second transistor TR2 are here linked to the same substrate land BC1 by the metallization 9. Although this connection is not essential, it makes it possible to bias both the source region S2 and the drain region D2 and therefore obtain a higher substrate B1 bias current.

Figure 5:
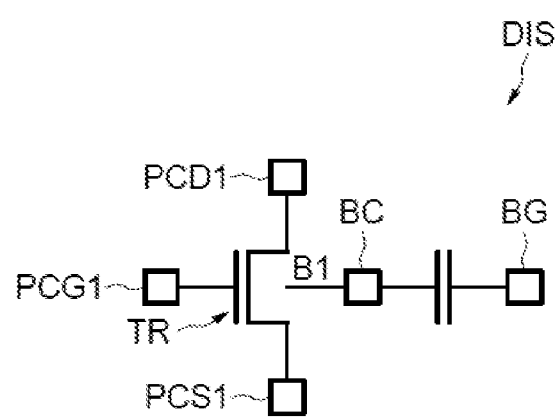
FIG. 5 is a functional representation of the FIG. 1 device.

Functionally, the device can be considered (FIG. 5) as a single transistor TR, having a front gate contact land PCG1, a rear gate contact land BG, a drain contact land PCD1, a source contact land PCS1 and a substrate contact land BC1.

Such a device makes it possible to obtain a very significant current gain (of the order of $10^5$).

Depending on the manner in which the transistor TR1 will be biased, it is possible to obtain different modes of operation, notably operation as MOS transistor, as bipolar transistor, or hybrid operation such as that described in U.S. Patent Application Publication No. 2013/0141824.

Figure 6:
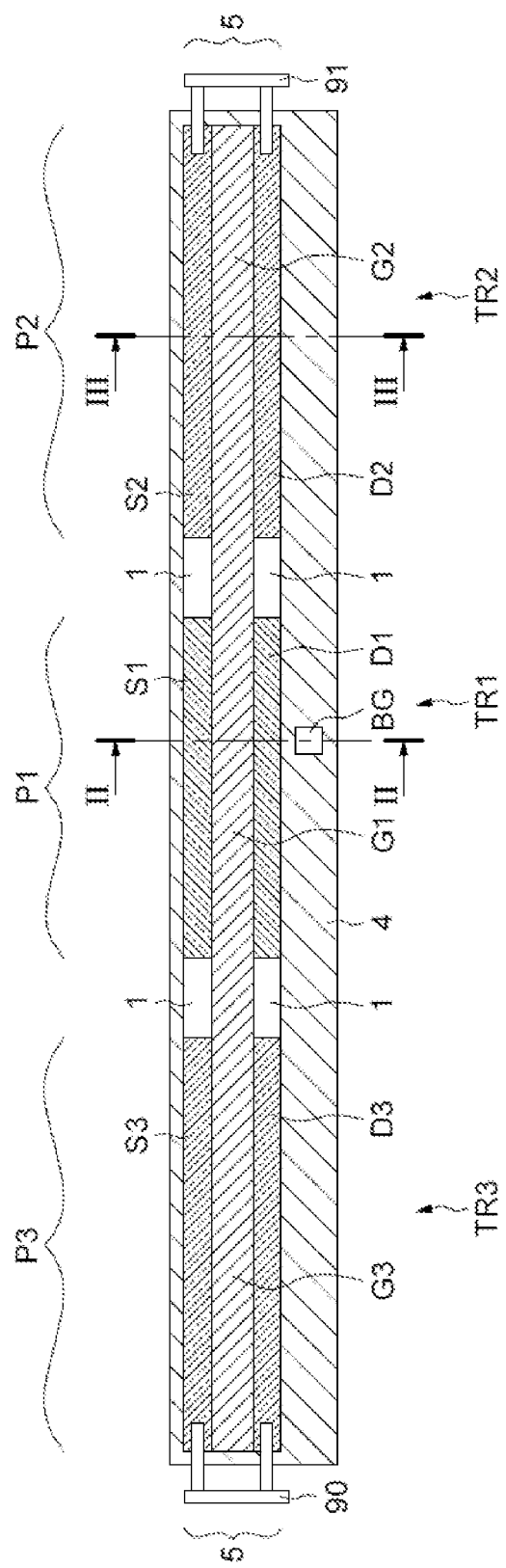
FIG. 6 is a plan view of an integrated device.

FIG. 6 illustrates a device according to an embodiment similar to that described in FIG. 3 which further comprises a third part P3 containing a third PMOS transistor TR3, having a structure similar to the second transistor TR2, and behaving like a second connection element for the biasing of the substrate B1 of the transistor TR1.

The second and the third transistors TR2 and TR3 are each situated on either side of the first transistor TR1.

By adding this third transistor TR3, it becomes possible to more effectively bias the substrate B1 of the transistor TR1, and obtain an additional mode of operation of the transistor, which will be described hereinbelow.

Since the transistor TR3 has no PN junction between its source/drain regions and its channel region, the biasing of one of its source S3 or drain D3 regions makes it possible to bias its substrate and therefore the substrate of the first transistor TR1.

Furthermore, since the wells of the first transistor TR1 and of the third transistor TR3 are identical and electrically connected, the contact BG makes it possible to bias both the rear face of the first transistor TR1, that of the second transistor TR2 and also that of the third transistor TR3.

Figure 7:
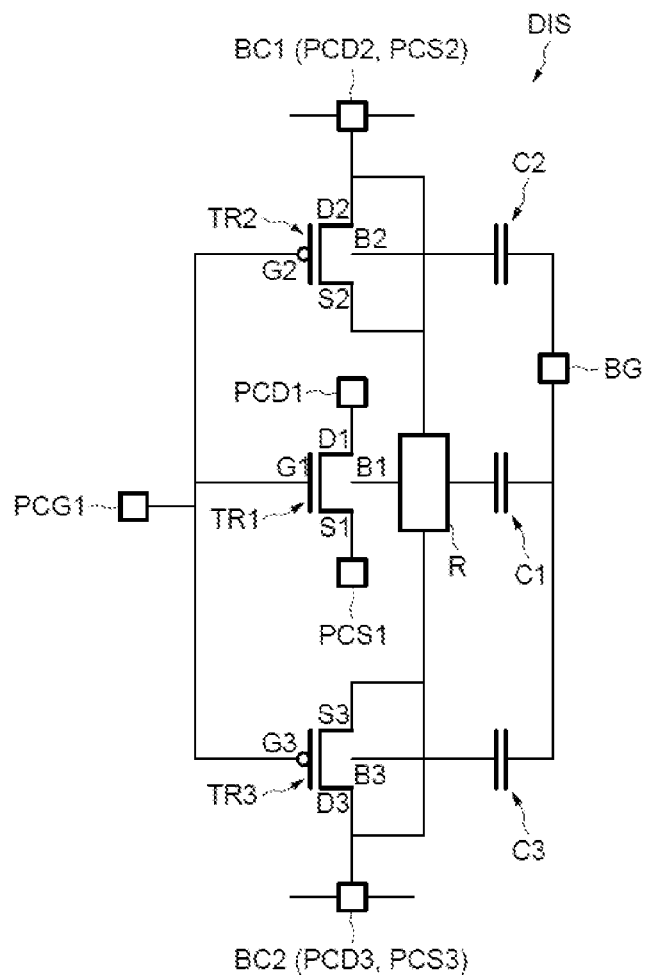
FIG. 7 is a schematic representation of the FIG. 6 device from an electrical point of view.

A schematic representation of this embodiment from an electrical point of view is illustrated in FIG. 7.

A device is represented therein that is similar to that illustrated by FIG. 4, to which is added the third transistor TR3, comprising its drain D3, source S3, substrate B3 and gate G3 regions, and the contact lands PCD2, PCS2 forming a second substrate contact land BC2 for the transistor TR1.

The capacitor C3 schematically represents the capacitor formed under the transistor TR3 by the semiconductor film 1, the insulating layer 2 and the well 3. In this embodiment, since the three wells of the transistors TR1, TR2 and TR3 are linked, they are represented as connected to the same contact BG.

Similarly, since the gate G3 is produced in the same line of gate material as the gates G1 and G2 of the transistors TR1 and TR2, it is represented as connected to the gate contact land PCG1.

The source S2 and drain D2 regions of the second transistor are here linked to the same substrate land BC1 by the metallization 91, and the source and drain regions of the third transistor are here linked to the same contact land BC2 by the metallization 90.

The resistor R symbolizes the resistance of the substrate B1 of the first transistor TR1.

Figure 8:
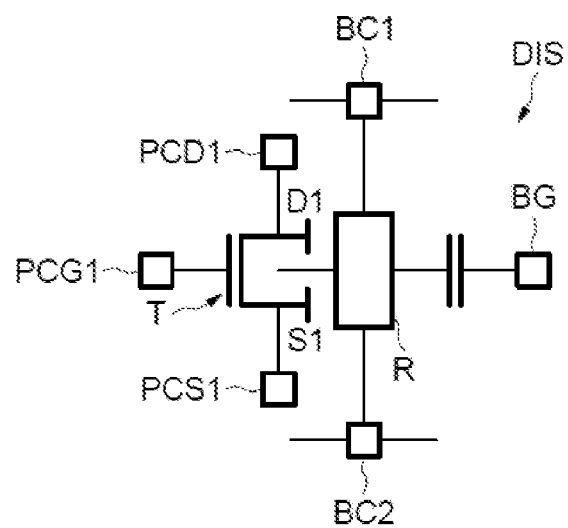
FIG. 8 is a functional representation of the FIG. 6 device.

Functionally, the device can be considered (FIG. 8) as an MOS transistor T with 4 gates, also known by those skilled in the art by the term "G$^4$-FET", and comprising six contact lands.

In this mode of operation, the two contact lands BC1 and BC2 are used as the electrodes of the transistor T. For example, the contact land BC1 corresponds to the source and the contact land BC2 corresponds to the drain.

The source S1 and the drain D1 of the first transistor TR1 are used as two gates of a JFET transistor with P channel. They can therefore here be biased in order to modulate the current circulating between the source BC1 and the drain BC2 of the transistor T.

The gate G1 and the rear gate of the transistor TR1, linked respectively to the contact lands PCG1 and BG, can also be biased in order to modulate the current, and also the resistance value R of the substrate B1. These two gates form the other two gates of the transistor T with four gates.

It should be noted that the embodiments represented here are in no way limiting.

Figure 9:
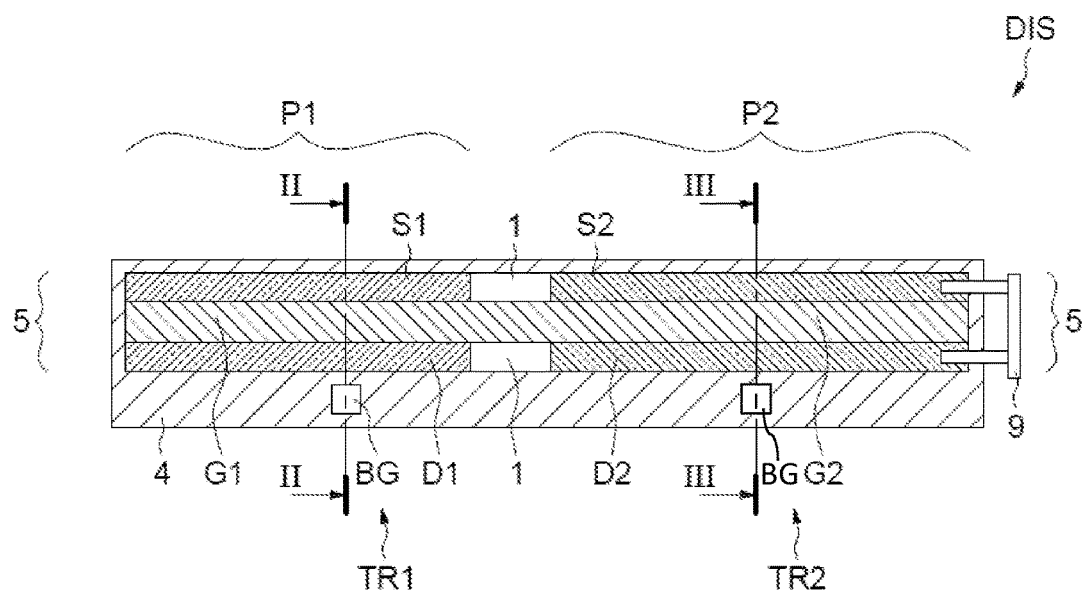
FIG. 9 is a plan view of an integrated device.
Figures 10, 11:
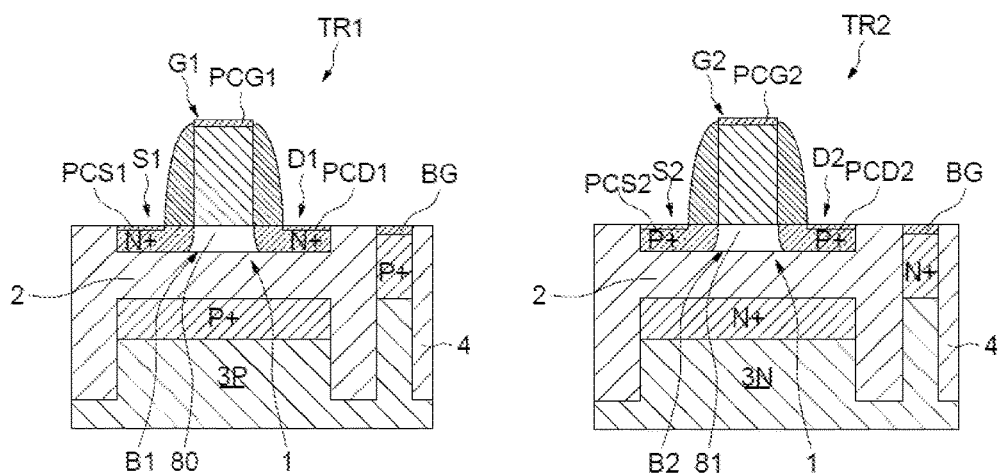
FIGS. 10 and 11 are cross-sectional views of FIG. 9.
Figure 12:
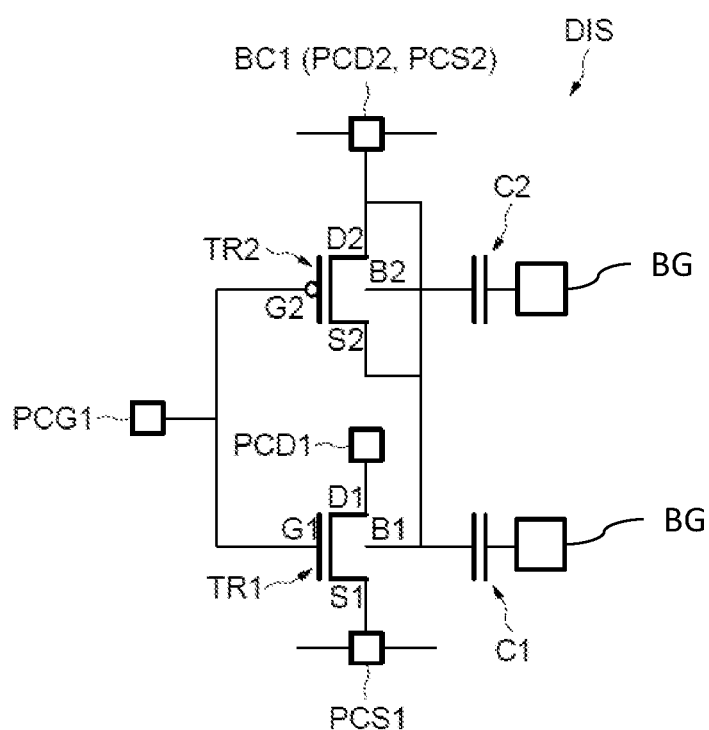
FIG. 12 is a schematic representation of the FIG. 9 device from an electrical point of view.

Notably, although, in this example, a same well land BG has been represented in FIG. 1, it would have been possible, through an insulation of the underlying wells with a p-well 3P and an n-well 3N, to independently bias each of the wells 3P and 3N by the rear face as shown in FIGS. 9-11 using two separate well lands BG. FIG. 12 is a mondification of FIG. 4 showing a schematic representation of the FIG. 9 device from an electrical point of view.

Furthermore, although a first NMOS transistor TR1 has been produced here associated with a second PMOS transistor TR2 without junction, it would have been possible for the first transistor TR1 to be a PMOS transistor and for the second transistor TR2 to be an NMOS transistor without junction. In this case, the semiconductor film 1 would have been of intrinsic N type, obtained from a substrate of intrinsic P type by an appropriate doping.

The invention claimed is:

1. An integrated circuit, comprising:
an intrinsic semiconductor film above a buried insulating layer that is situated above a bearer substrate including a first well of a first conductivity type and a second well of a second conductivity type;
an insulating region delimiting a first active zone in the intrinsic semiconductor film over the first well and separated from the first well by the buried insulating layer and further delimiting a second active zone in the intrinsic semiconductor film over the second well and separated from the second well by the buried insulating layer;
a first metal oxide semiconductor (MOS) transistor situated in and on the first active zone; and
a first connection element situated in and on the second active zone, the first connection element being structurally similar to a second MOS transistor without any PN junctions between source/drain regions and a channel region, at least one source or drain contact land of the second MOS transistor forming at least one substrate contact land for the first MOS transistor.

2. The integrated circuit according to claim 1, wherein gate regions of the first and second MOS transistors are linked and incorporated in a same line of gate material.

3. The integrated circuit according to claim 1, wherein the second MOS transistor comprises a source contact land and a drain contact land that are mutually electrically linked by an electrically conductive link.

4. The integrated circuit according to claim 1, further comprising a first well land configured to bias said first well and a second well land configured to bias said second well.

5. The integrated circuit according to claim 4, wherein the second MOS transistor comprises a source contact land and a drain contact land that are mutually electrically linked by an electrically conductive link to the first well land.

6. The integrated circuit according to claim 1, wherein the silicon film is of intrinsic P type, the first MOS transistor is an NMOS transistor, and the second MOS transistor is a PMOS transistor.

7. The integrated circuit according to claim 1, wherein said intrinsic semiconductor film is fully depleted semiconductor material.

8. The integrated circuit according to claim 1, wherein said intrinsic semiconductor film is intrinsic semiconductor material of the first conductivity type.

9. An electronic device, comprising:
- an intrinsic semiconductor film above a buried insulating layer that is situated above a bearer substrate including a first well of a first conductivity type and a second well of a second conductivity type;
- an insulating region delimiting a first transistor region and a second transistor region in the intrinsic semiconductor film;
- the first transistor region including source and drain regions of the second conductive type on opposite sides of a first body region formed from the intrinsic semiconductor film;
- the second transistor region including source and drain regions of the first conductive type on opposite sides of a second body region formed from the intrinsic semiconductor film;
- a gate line extending over and insulated from the first and second body regions;
- a first well land configured to bias said first well and a second well land configured to bias said second well.

10. The integrated circuit of claim 9, further comprising an electrical connection which connects the source and drain regions of the first conductive type for the second transistor region.

11. The integrated circuit of claim 10, wherein said electrical connection further connects to the first well land.

12. The integrated circuit of claim 9, wherein the first transistor region is associated with an nMOS transistor and the second transistor region is associated with a pMOS transistor.

13. The integrated circuit of claim 9, wherein said intrinsic semiconductor film is fully depleted semiconductor material.

14. The integrated circuit of claim 9, wherein said intrinsic semiconductor film is intrinsic semiconductor material of the first conductivity type.

* * * * *